United States Patent
Yap et al.

(10) Patent No.: US 7,309,171 B2
(45) Date of Patent: Dec. 18, 2007

(54) OPTICAL BOND-WIRE INTERCONNECTIONS AND A METHOD FOR FABRICATION THEREOF

(75) Inventors: Daniel Yap, Thousand Oaks, CA (US); Michael Yung, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/725,771

(22) Filed: Mar. 19, 2007

(65) Prior Publication Data

US 2007/0172176 A1 Jul. 26, 2007

Related U.S. Application Data

(62) Division of application No. 10/649,075, filed on Aug. 26, 2003, now Pat. No. 7,207,728, which is a division of application No. 09/648,689, filed on Aug. 25, 2000, now Pat. No. 6,655,853.

(51) Int. Cl.
*G02B 6/36* (2006.01)
(52) U.S. Cl. ............................. 385/88; 385/14; 385/47
(58) Field of Classification Search .................. 385/14, 385/31, 47–49, 88, 94
See application file for complete search history.

(56) References Cited

U.S. PATENT DOCUMENTS 5,911,022 A * 6/1999 Plickert et al. ............... 385/49
6,477,302 B2 * 11/2002 Tatoh ............................ 385/49

* cited by examiner

*Primary Examiner*—Euncha P. Cherry
(74) *Attorney, Agent, or Firm*—Ladas & Parry

(57) ABSTRACT

Optical bond-wire interconnections between microelectronic chips, wherein optical wires are bonded onto microelectronic chips. Such optical connections offer numerous advantages compared to traditional electrical connections. Among other things, these interconnections are insensitive to electromagnetic interference and need not be located at the edges of a chip but rather can be placed for optimal utility to the circuit function. In addition, such interconnections can be given the same or other pre-specified lengths regardless of the placement in the module and they are capable of signal bandwidths up to 20 Gigahertz without causing a cross-talk problem. A method of fabrication of such optical interconnections using optical fiber, a laser or photodetector and etched mirror and etched V-shaped grooves.

20 Claims, 6 Drawing Sheets

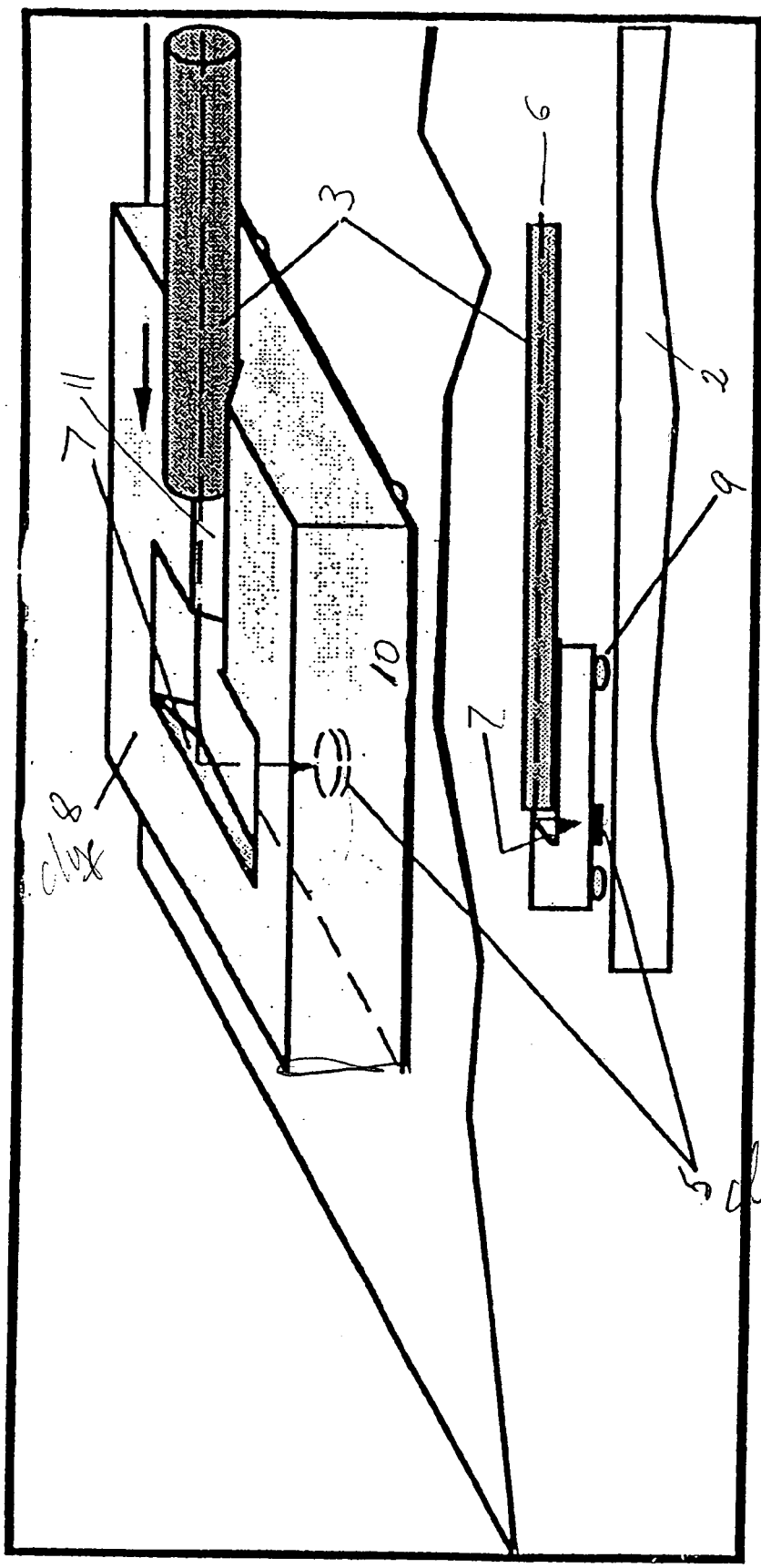

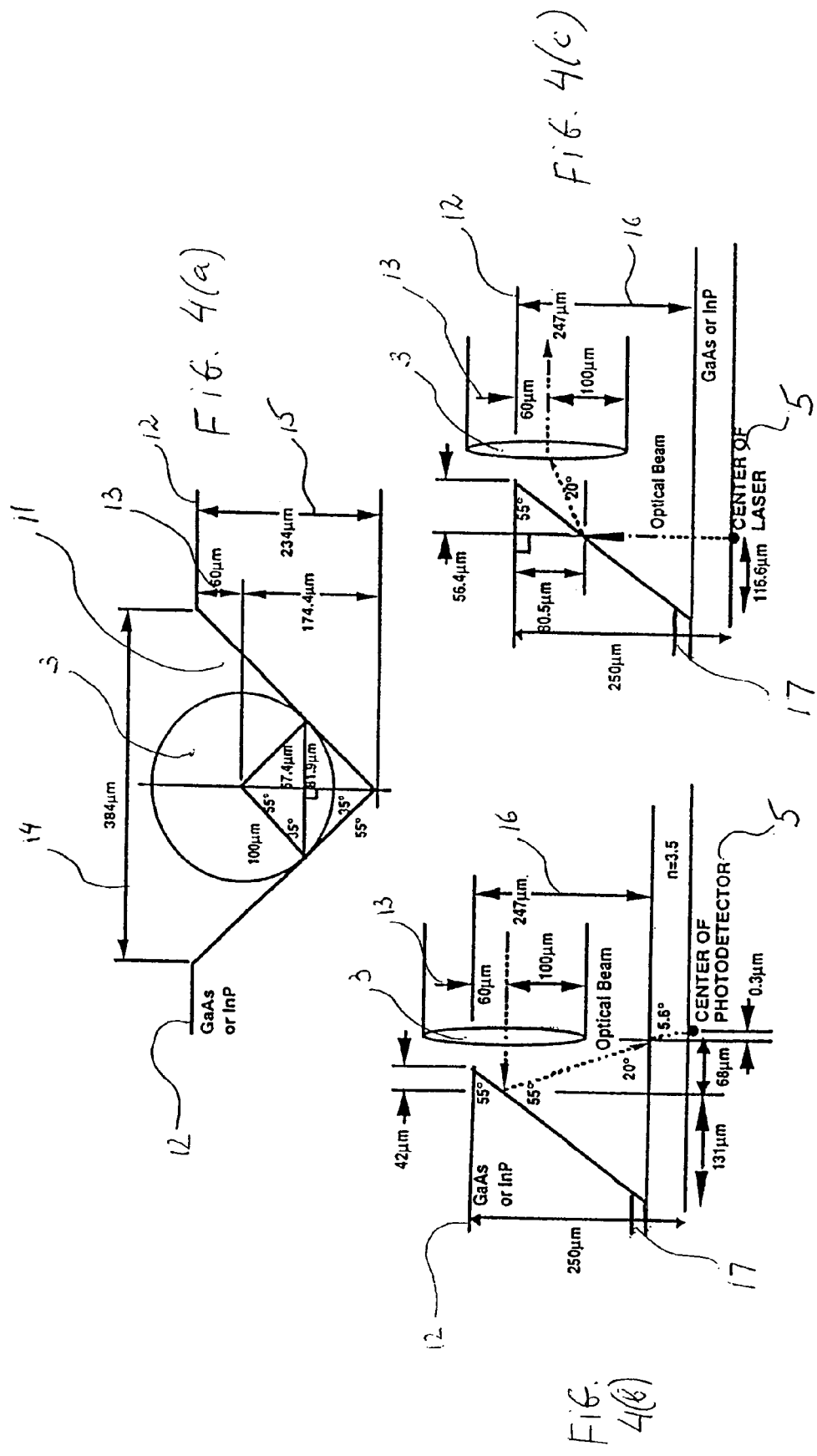

OPTICAL BOND-WIRE INTERCONNECTIONS AND A METHOD FOR FABRICATION THEREOF

CROSS REFERENCE TO RELATED APPLICATIONS

This patent application is a divisional application of U.S. Ser. No. 10/649,075, filed on Aug. 26, 2003, now U.S. Pat. No. 7,207,728 which is a divisional of U.S. Ser. No. 09/648,689, filed Aug. 25, 2000, now U.S. Pat. No. 6,655,853 issued on Dec. 2, 2003.

I. BACKGROUND OF THE INVENTION

1. Field of the Invention

This invention relates to the interconnection of microelectronic chips. The interconnections may be between chips on a multi-chip module, between several multi-chip modules, or even between distant points on a larger chip. More particularly, it pertains to the use of optical wires bonded on those chips to interconnect the chips. The interconnections by means of optical fibers are made to substitute for the electrical wire interconnections. Each optical wire terminates at a small laser chiplet on one end and a photodetector chiplet on the other end. Each chiplet is flip-chip mounted onto the larger electronic chips and each contains a vertically coupled laser or photodetector and solder bumps on one face and a deflecting mirror and a V-groove (into which one end of the optical fiber is inserted) on the opposite face.

2. Description of the Related Art

In a high speed multi-chip module (MCM) environment, chip-to-chip connections are usually made using bond wires, with microstrip lines on the MCM substrate used to interconnect chips that are farther apart.

Presently, electrical bond wires are used to interconnect microchips. Using the electrical wires has serious drawbacks. The electrical wires are sensitive to electromagnetic interference and themselves create such interference which poses especially serious problems for distribution of timing signals. The electrical wires must be located at the edges of chips. Signal attenuation and phase delay depend upon the length of the electrical wires. Thus, depending on the lengths of the electrical wires and their locations in the module, it may be difficult to achieve equal attenuation and/or equal signal phase delay among multiple wires, if needed.

In addition, in many cases signal bandwidths of several Gigahertz are desirable but cannot be achieved if electrical wires are used because electrical bond wires act as open antennae at high frequencies and introduce noise coupling among the wires. For example, bond wires of 500 micrometers in length and 1 mil (0.001 inch) diameter carrying 10 milliamperes of current will produce appreciable (100 millivolts or more) coupling or cross-talk at 10 Gigahertz even when they are spaced several pitch distances apart, a typical pitch being 100 to 150 micrometers. This effect will substantially limit the maximum speed of a typical MCM module having hundreds of bond wires from several chips. The cross-talk is even more severe when the chips are located farther apart and require longer bond wires.

Therefore, there is a need to have interconnects between microchips which:

(a) are insensitive to electromagnetic interference;
(b) need not be located at the edges of a chip but rather can be placed for optimal utility to the circuit function;
(c) can be given the same or other pre-specified lengths regardless of the placement in the module; and
(d) are capable of signal bandwidths up to 20 Gigahertz without causing the cross-talk problem.

Optical bond-wire interconnections satisfy all these requirements. Previously, optoelectronic devices such as vertical-cavity lasers and photodetectors have been bonded onto microelectronic chips to provide free-space optical interconnections and the results were reported, for instance, by D. A. Louderback, et al., in "Modulation and Free-Space Link Characteristics of Monolithically Integrated Vertical-Cavity Lasers and Photodetectors with Microlenses", IEEE Journal of Selected Topics in Quantum Electronics, Vol. 5, No. 2 (1999).

However, for such free-space interconnections, the optoelectronic devices must be installed in a way that they face one another. Moreover, their relative locations must be precisely controlled to ensure optical alignment. As a result, in free-space optical interconnections, the optoelectronic devices must be located on different multi-chip modules that are held in immediately adjacent slots of a rack.

With optical interconnect wires bonded directly onto microelectronic chips there is almost no constraint on the locations of the chips to be interconnected. The chips may reside on the same multi-chip module or may be disposed many meters apart. These chips can even be members of different instruments or computation units; however, if the optical-fiber bond-wire is subject to movement, then some mechanical means is preferably provided to relieve the optical fiber and chiplets from excessive strain.

In the prior art, optical fibers are typically coupled to optoelectronic devices using an accompanying sub-mount, such as a machined piece of metal, or ceramic, or a V-grooved silicon substrate, when both the optical fiber and the optoelectronic device chip are mounted on the sub-mount. Directly attaching and optically aligning an optical fiber to an optoelectronic chip would be most beneficial.

There exists no known prior art for fiber-based optical interconnects bonded directly onto microelectronic chips. Yet, as discussed above, the need for such is acute.

For the foregoing reasons, there is a necessity for optical bond-wire interconnections. The present invention discloses such interconnections.

II. SUMMARY OF THE INVENTION

The present invention is directed to an optical bond-wire interconnect and to a method of manufacturing of the interconnect. It can be used instead of electrical bond-wires but can be much longer than the electrical bond-wires. For instance, length of an electrical wire typically does not exceed maximum length of 1 centimeter and is usually shorter. An optical bond-wire can reach lengths of the order of hundreds of meters.

Each optical bond-wire comprises a segment of optical fiber that is attached at its two ends by means of terminations to the microelectronic chip or chips. The two terminations of the optical bond-wire are a laser chiplet on one end of the optical bond-wire and a photodetector chiplet on the other end. Each chiplet can be as small as 250 by 250 micrometers and is connected to two electrical lines—one line is the signal to be sent via the interconnect and the other line is a return or ground.

III. BRIEF DESCRIPTION OF THE DRAWINGS

The features and advantages of the present invention will be better understood with regard to the following description, appended claims, and accompanying drawings where FIG. 1 is a schematic diagram showing an optical bond-wire interconnection for electrical signals.

FIG. 2 is a schematic diagram showing a method for connecting an optical fiber to the optoelectronic termination laser or photodetector.

FIGS. 4(a)-4(c) are schematic diagrams showing an example of the optical design for an optoelectronic termination.

FIGS. 5(a)-5(g) are schematic diagrams showing step-by-step method of fabrication of an optical bond-wire interconnection of the present invention.

IV. DETAILED DESCRIPTION OF THE INVENTION

Figure 1:
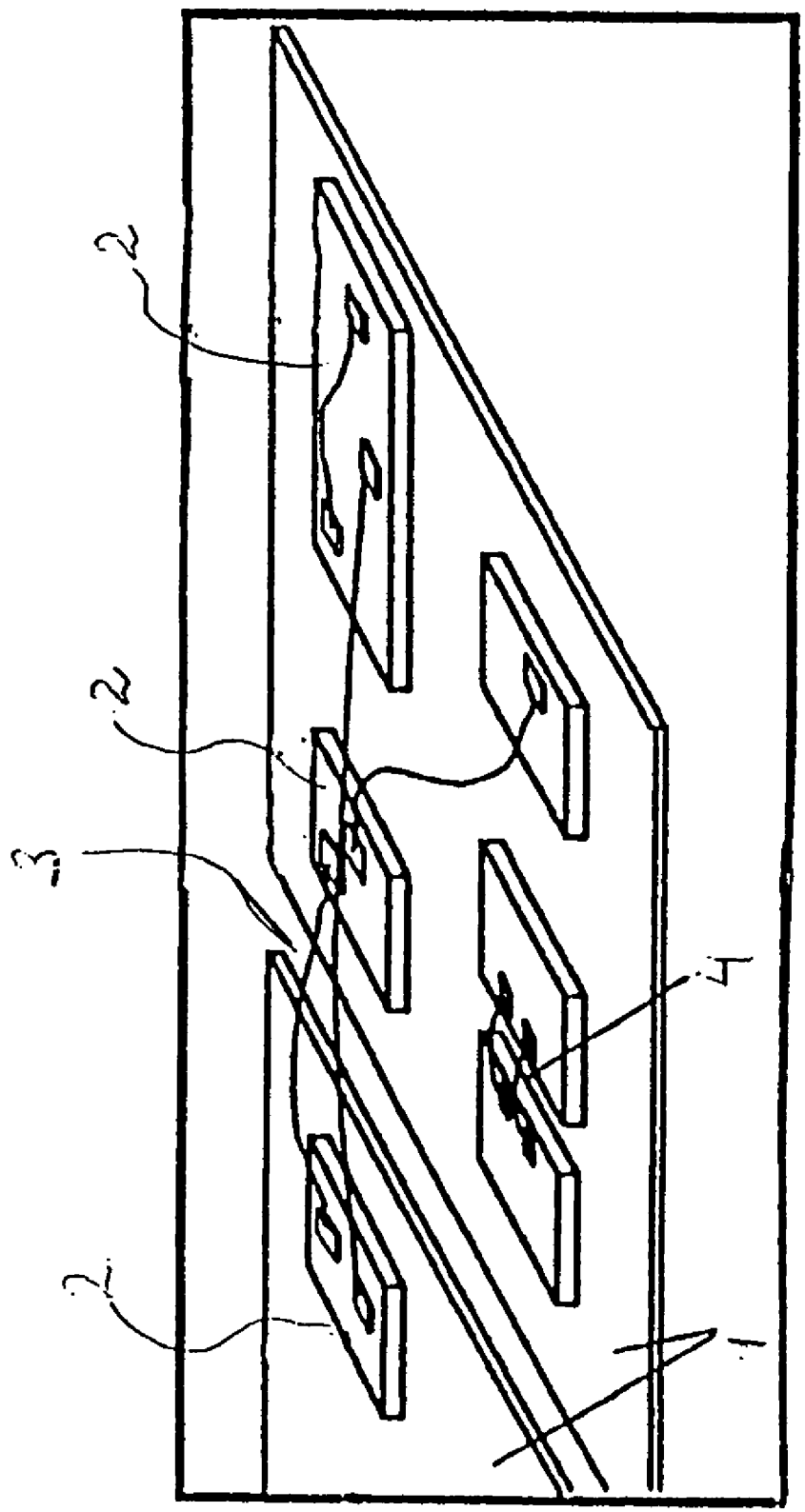

A preferable optical bond-wire interconnection for electrical signals is schematically illustrated on FIG. 1. Optical bond-wires 3 may be used to interconnect monolithic microwave integrated circuits (MMIC) 2, for example. The MMICs can be located on the same multi-chip module (MCM) 1 or on different MCMs. As can be seen from FIG. 1, the length of optical bond-wires 3 can be substantially longer than that of electric wires 4. There is no need for MMICs to be immediately adjacent in the case of optical bond-wire interconnections. As pointed out above, the length of optical bond-wires can reach hundreds of meters.

A segment of optical fiber is attached at its two ends by means of terminations to the microelectronic chips. The two terminations of the optical bond-wire are a laser chiplet on one end of the optical bond-wire and a photodetector chiplet on the other end. A connection of the optical bond-wire 3 to an optoelectronic termination is shown on FIG. 2. The termination comprises a laser or photodetector 5 which is optically coupled to the optical fiber 3 and electrically coupled to the MMIC 2. Both the laser and photodetector are edged coupled devices or, preferably, vertically coupled devices, such as vertical-cavity surface emitting laser (VCSEL) and PIN photodiode detector (hereinafter, PIN) or metal-semiconductor-metal (MSM) photodetector, respectively.

The optical fiber 3 is preferably mounted onto the backside of the optoelectronic laser or photodetector chiplet 8. Other, non-preferred methods of mounting the optical fiber 3 include mounting where the optical fiber comes directly from the top of chiplet 8 and mounting by etching an opening in the back of the substrate followed by direct insertion of the optical fiber.

After the optical fiber 3 has been mounted onto the backside of the optoelectronic laser or photodetector chiplet 8, it is attached and held in place, preferably, using adhesives such as UV-curable epoxy resins commonly known to those reasonably skilled in the art.

The optical path is defined in such a way that light is deflected from the optical fiber bond-wire 3, through the substrate and to the photodetector 5, or vice versa in the case of the termination being the laser 5. The substrate materials of the chiplets 8 are preferably gallium arsenide or indium phosphide.

Electrical signals and power to and from the optoelectronic chip 8 are delivered via, preferably, solder bumps 9. As an alternative to the solder bumps 9, gold/gold compression bonds can also be used instead. A chiplet 8 comprises at least three, and preferably four, solder bumps 9, at least two of which are electrically connected to the microelectronic chip or the MMIC 2.

A preferred kind of the solder bumps is precision electroplated solder bumps disclosed in U.S. patent application Ser. No. 09/522,803, currently pending. Other kinds of solder bumps commonly used by those reasonably skilled in the art may also be used. The solder bumps 9 also provide mechanical support for the chiplet 8 and its physical adhesion to the MMIC 2.

Standard methods known to those reasonably skilled in the art are used to fabricate the optical fiber 3 and to cleave the fiber into the desired length for the bond-wire. Commercially available optical fiber is used. In particular, for the design shown on FIGS. 4(a)-4(c), a multi-mode optical fiber manufactured by Fiberguide Industries Corp. of New Jersey, is used. The optical fiber has a fairly large numerical aperture, preferably 0.35 or more.

Standard methods known to those reasonably skilled in the art are also used to fabricate the solder bumps 9, as well as the laser and photodetectors 5. A method for fabrication of the preferred solder bumps, the precision electroplated solder bumps, is disclosed in U.S. patent application Ser. No. 09/522,803, currently pending.

Laser and photodetector units 5 are available from University of California at Santa Barbara of Santa Barbara, Calif. The lasers and photodetectors 5 to be used are those which operate at an optical wavelength for which the substrate material of the chiplet 8 is transparent.

Suitable VCSELs are emitting at such wavelengths so that the selected substrates be transparent and the signal be detectable by the photodetectors. In particular, in case of gallium arsenide substrates, the preferred VCSELs are those emitting preferably at a wavelength of about 980 nanometers or about 1,300 nanometers and in case of indium phosphide substrates—at a wavelength of about 1,300 nanometers or about 1,550 nanometers.

For photodetectors, those that are sensitive in the range of wavelengths between about 980 nanometers and about 1,550 nanometers are suitable for both gallium arsenide and indium phosphide substrates.

The optical bond-wire interconnect further comprises, preferably, a mirror 7 and a V-shaped groove 11, as shown on FIG. 2, for holding the optical fiber 3. The face of the mirror 7 slopes downward and outward from the surface of the wafer. At the same time, the walls of the V-shaped groove 11 slope downward and inward.

The mirror 7 and the groove 11 are preferably fabricated simultaneously and are positioned perpendicularly to each other. This perpendicular positioning of the mirror 7 and the groove 11 is not required but is strongly preferred. Depending on the design of the device, those reasonably skilled in the art will modify the relative positioning of the mirror 7 and the groove 11 and may choose an angle other than 90° between them.

The process of such simultaneous fabrication is only possible due to the fact that both gallium arsenide and indium phosphide substrates, on which the mirror 7 and the groove 11 are formed, preferably have a zinc-blende crystallographic structure. A consecutive fabrication of the mirror 7 and the groove 11 is also possible, but the simultaneous fabrication is easier to achieve and allows automatic alignment, which the consecutive fabrication does not provide. The zinc-blende structure is not required but is preferred as it makes the fabrication process easy. Those skilled in the art may modify the process and choose a structure other than the zinc-blende structure.

Figure 5A:
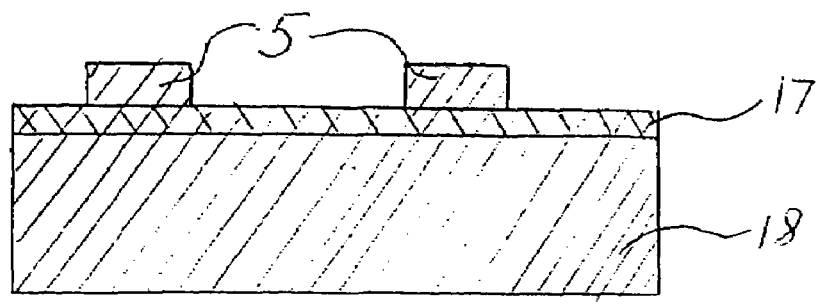

First, the laser or photodetector 5 is fabricated on a first side of a wafer, or substrate 18, preferably, on a gallium arsenide or indium phosphide substrate, as shown on FIG. 5(a). The process for such fabrication comprises the epitaxial growth of the laser or photodetector 5 material. An etch-stop layer 17 is grown first, underneath the device layers and on the substrate wafer 18. The second side of the wafer 18 is then thinned and polished which step determines the depth of the mirror channel to be discussed below.

Next, the mirror 7 and the V-groove 11, as shown on FIG. 2, are preferably formed on the back side of the wafer. Such step of the formation of the mirror 7 and the V-groove 11, as shown on FIG. 2, preferably comprises the following substeps.

Figure 5B:
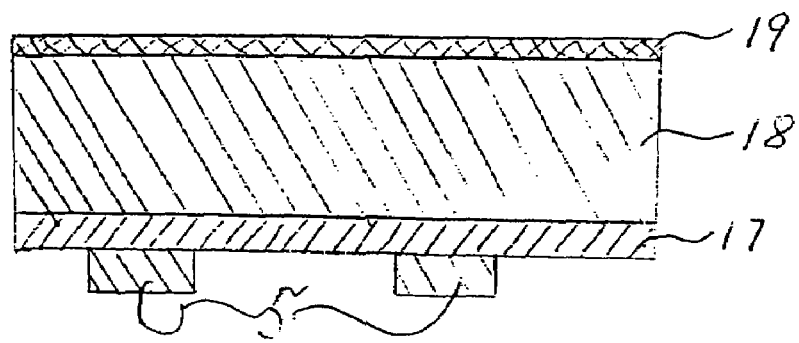

First, a thin film of preferably silicon nitride 19 is deposited on the back side of the wafer, with the thickness preferably greater than about 300 nanometers, as shown on FIG. 5(b). Following the deposition of the silicon nitride film 19, a thin layer of photoresist 20 is deposited and patterned on top of the silicon nitride film 19. The photoresist material is a typical and commonly known material used by those skilled in the art and is applied according to well known techniques also know to those reasonably skilled in the art. The thin film 19 of silicon nitride can be deposited by the method of plasma-enhanced chemical vapor deposition, by sputtering or by high temperature chemical vapor deposition.

Figure 5C:
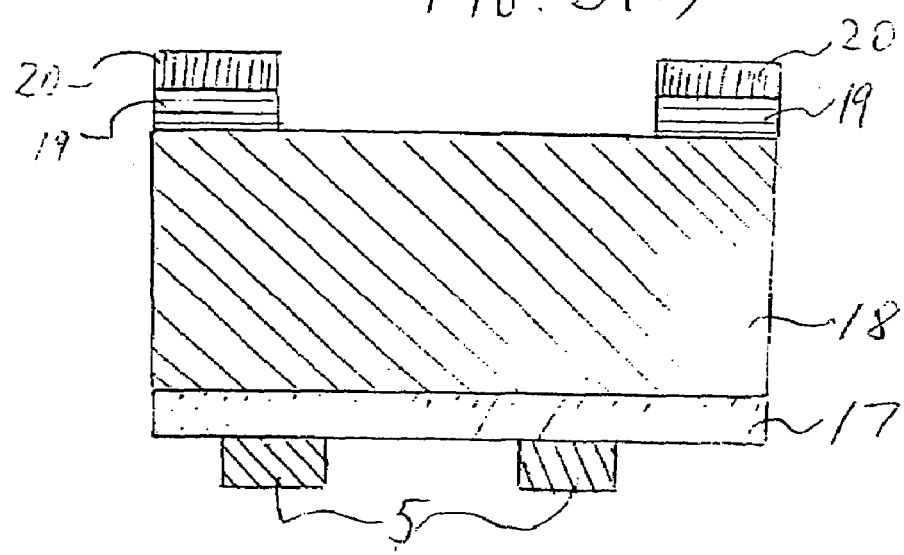

As shown on FIG. 5(c), T-shaped openings are next patterned into the silicon nitride film 19 by photolithographic techniques known to those reasonably skilled in the art and standard wet or dry etching processes of the silicon nitride also known to those reasonably skilled in the art. The "T" shape of the openings is preferred, but some other shapes, for example "I" shape, are also possible.

The "T" on the back side of the wafer 18 is precisely aligned with the laser or photodetector 5 formed on the top side followed by the formation of the mirror 7 and the V-groove 11, as shown on FIG. 2, in the top and the trunk of the "T" respectively. The preciseness of the alignment is preferably within a few micrometers deviation and the alignment is achieved and measured using standard techniques and instruments known to those reasonably skilled in the art.

Figure 5D:
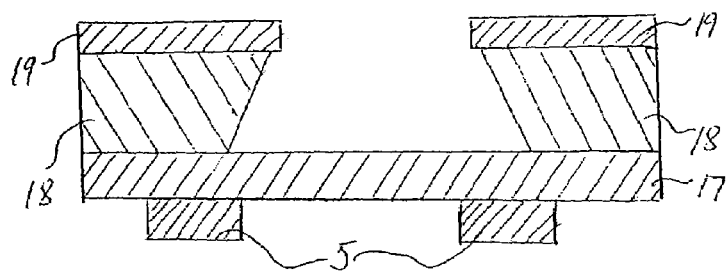
Figure 5E:
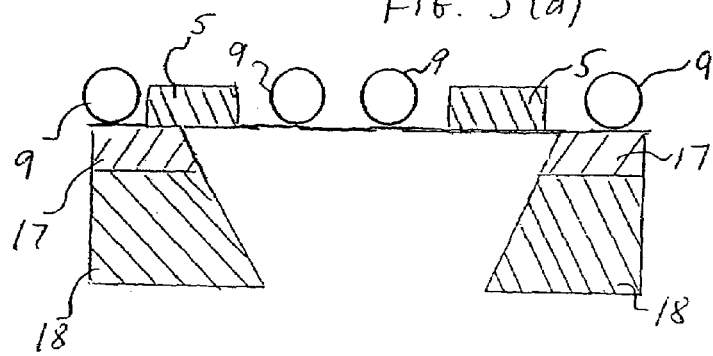
Figure 5F:
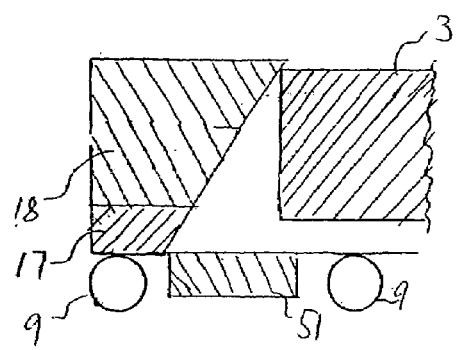
Figure 5G:
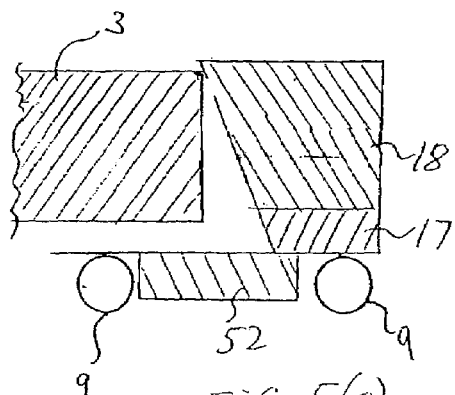

The mirror 7 and the V-groove 11 are preferably formed by wet-chemical etching, as shown on FIG. 5(d). A preferred etchant for both gallium arsenide and indium phosphide substrates 18 is about 2% solution of bromine in methanol. An acceptable alternative etchant for gallium arsenide substrate 18 is a mixture of hydrogen peroxide and an acid, such as hydrochloric acid. The ratios between the components in the etchant mixtures are common and known to those skilled in the art.

Figure 3B:
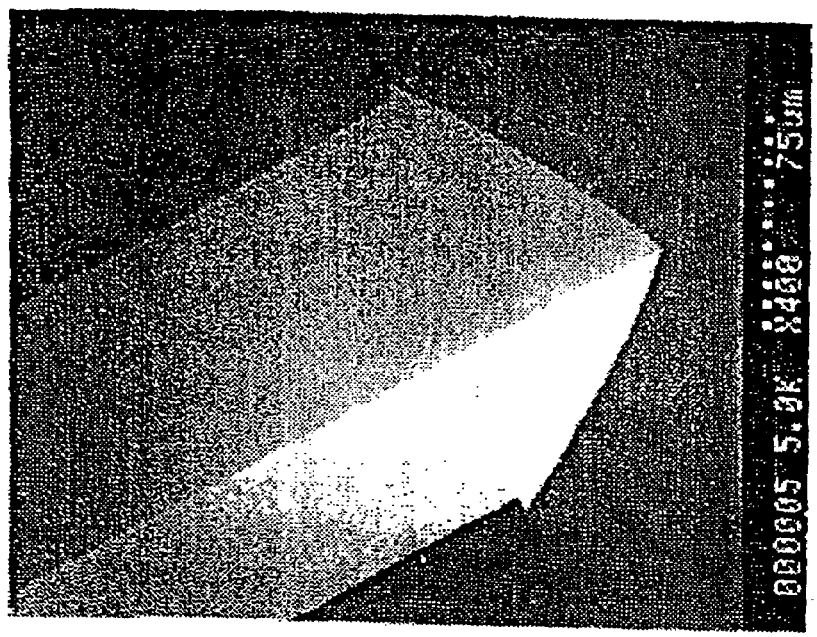
FIG. 3(b) is a picture of a V-shaped holder fabricated by wet-chemical etching into gallium-arsenide.
Figure 3A:
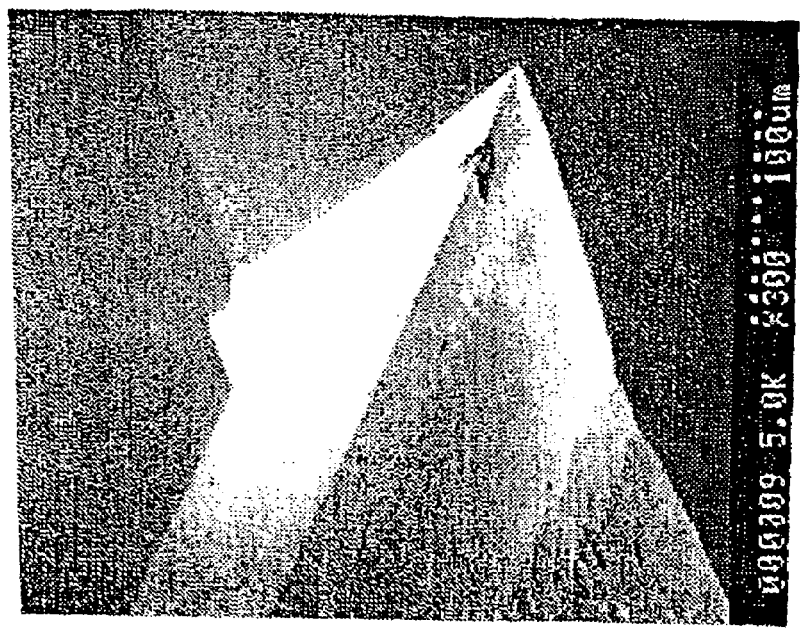
FIG. 3(a) is a picture of an etched mirror fabricated by wet-chemical etching into gallium-arsenide.

Well-defined etched profiles and the smooth surfaces obtained with the use of $H_2O_2$-HCl mixture are shown on FIG. 3. The mirror 7 and the V-groove 11, shown on FIG. 2, are precisely aligned along specific crystallographic directions. For instance, if the back side of the substrate is a (100) crystallographic surface, the V-groove 11 is aligned along the (01) direction and the mirror 7 is aligned along the (0) direction. This crystallographic alignment can be accomplished manually or with the use of standard instruments according to standard techniques known to those skilled in the art.

Reproducible etching is done by controlling the undercutting achieved by proper choice and fabrication of the thin-film masking material. Such choice and fabrication are known to those skilled in the art. FIG. 3 also illustrates the amount of undercutting. Etching of the mirror 7 and the V-groove 11 is continued until the etch-stop layer 17 is exposed.

After the formation of mirror 7 and the V-groove 11, the photoresist layer 20 and the silicon nitride layer 19 are etched away using common and known etching techniques. This step is followed by the fabrication of solder bumps 9 on top (first) side of the wafer 18, as shown on FIG. 5(e).

Multiple chiplets 8 can be fabricated on one wafer 18 followed by the dicing of the chiplets 8 from the wafer 18 into separate laser chiplets 51 or photodetector chiplets 52. Finally, the optical fiber 3 is inserted into the V-groove 11 and attached to a chiplet 8 as shown on FIGS. 5(f) and 5(g) for the laser chiplets and for the photodetector chiplets, respectively.

EXAMPLE 1

An example of an optical design is shown on FIGS. 4(a)-4(c). This example is introduced solely for the purposes of illustration of a possible design and is not to be construed a limitation.

The design shows relative positions of the optical fiber 3 and the optoelectronic laser or photodetector 5. This design can be used to specify the photolithographic fabrication masks and the etching parameters.

For a bromine-methanol etchant described above, and under the etching conditions used for this example, the resulting mirror 7 is inclined at an angle of about 55° and deflects the optical beam into the wafer substrate. The resulting V-groove 11 has sidewalls inclined at an angle of also about 55°. The optical fiber 3 has a core diameter of about 100 micrometers and a cladding diameter (not shown) of about 200 micrometers. To ensure that the core of the optical fiber 3 is entirely beneath the surface of the wafer 12, the optical fiber 3 is set into V-groove 11 in such a way so that the optical fiber's 3 optical axis is located at a depth 13 of about 60 micrometers.

The width 14 and the depth 15 of the V-groove 11 are about 384 micrometers and 234 micrometers, respectively, as shown on FIG. 4(a).

Since the etching rate of the V-groove 11 slows considerably once the point of the "V" has been formed, the depth 16 of the mirror channel [FIGS. 4(a) and 4(b)] is greater than the depth 15 of the V-groove 11 and is about 247 micrometers. An etch-stop layer 17, is preferably grown epitaxially.

The etch-stop layer 17 has a thickness within a range of between about 0.01 nanometers and about 0.5 nanometers, preferably, within a range of between about 0.02 nanometers and about 0.2 nanometers, and is made of preferably aluminum arsenide for the gallium arsenide substrate 18 and of preferably indium aluminum arsenide for the indium phosphide substrate 18.

When the mirror 7 is being etched, the etching is allowed to continue until the etch-stop layer 17 is reached. This technique ensures that the bottom surface of the mirror channel is flat and smooth because the etching would otherwise produce a non-flat surface at the bottom of the mirror channel. Following the etching process, the etch-stop layer 17 is optionally removed by a known method.

The distance between the etch-stop layer 17 and the light-emitting or light-absorbing area of the optoelectronic device 5 is designed to be between about 1 and about 5 micrometers, preferably, about 3 micrometers. The locations of the optoelectronic devices 5 are illustrated on FIG. 4(b)

(for a photodetector) and FIG. 4(c) (for a laser). The space where the light travels can be sealed, for example with an epoxy sealant.

For typical applications where the optical bond wires 3 have lengths of up to about several meters, and the signal bandwidth or pulse rate is below about 20 Gigahertz, a multimode optical fiber can be used, preferably having a numerical aperture of about 0.4. The fiber core diameter can be as low as 50 micrometers and the cladding diameter is preferably between about 125 and about 200 micrometers.

The photodetector 5 should have a size at least as large as the fiber core in order to capture all the light from the fiber. The diameter of the laser 5 is preferably between about 10 and about 30 micrometers.

Having described the invention in connection with several embodiments thereof, modification will now suggest itself to those skilled in the art. As such, the invention is not to be limited to the described embodiments except as required by the appended claims.

We claim:

1. A method of optically interconnecting at least two metallization points, the method comprising:
   selecting an optical wire comprising:
   a first termination adapted to be placed directly onto a first metallization point, wherein the first termination comprises a first substrate, a photodetector connected with the first substrate, and at least one first terminal adapted to electrically connect the first metallization point with the photodetector;
   a second termination adapted to be placed directly onto a second metallization point, wherein the second termination comprises a second substrate, a laser connected with the second substrate, and at least one second terminal adapted to electrically connect the second metallization point with the laser;
   an optical fiber optically contacting the first and second terminations;
   bonding the first termination onto the first metallization point; and
   bonding the second termination onto the second metallization point.

2. The method of claim 1, wherein the first and second terminations each comprise a groove and a mirror.

3. The method of claim 1, wherein said optical fiber is disposed within a first groove of the first termination and a second groove of the second termination.

4. The method of claim 1, wherein said bonding comprises using solder bumps or gold/gold compression bonds.

5. The method of claim 1, wherein an optical path is established so that light travels from said laser to said photodetector.

6. The method of claim 1, wherein said terminations are having a size of not more than about 250 micrometers in width and not more than about 250 micrometers in length.

7. The method of claim 1, wherein said laser comprises a vertical-cavity surface emitting laser.

8. The method of claim 1, wherein said photodetector comprises a PIN photodiode detector or a metal-silicon-metal photodetector.

9. The method of claim 2, wherein said mirror is disposed on a second side of said terminations.

10. The method of claim 2, wherein a second side of said substrate is a (100) crystallographic surface, said groove is aligned along (011) crystallographic direction and said mirror is aligned along (011) crystallographic direction.

11. The method of claim 1, wherein said first and second substrates comprise a Zinc-blende crystallographic structure.

12. The method of claim 1, wherein said laser emits at a wavelength selected from a group of wavelengths, said group comprising wavelengths of about 980 nanometers or about 1300 nanometers.

13. The method of claim 1, wherein said laser emits at a wavelength selected from a group of wavelengths, said group comprising wavelengths of about 1300 nanometers or about 1550 nanometers.

14. The method of claim 1, wherein said photodetector is sensitive within a range of wavelengths between about 980 nanometers and about 1550 nanometers.

15. The method of claim 1, wherein the first metallization point is located in a first microelectronic chip.

16. The method of claim 15, wherein the second metallization point is located in the first microelectronic chip.

17. The method of claim 15, wherein the second metallization point is located in a second microelectronic chip.

18. The method of claim 1, further comprising:
   receiving an electrical signal from the second metallization point;
   generating an optical signal using the laser based on the electrical signal;
   transmitting the optical signal through the optical fiber;
   converting the optical signal into another electrical signal using the photodetector; and
   transmitting the another electrical signal to the first metallization point.

19. The method of claim 15, wherein the photodetector is disposed on a first side of the first substrate.

20. The method of claim 15, wherein the laser is disposed on a first side of the second substrate.

* * * * *